(12) United States Patent
Shimono et al.

(10) Patent No.: US 12,720,848 B2
(45) Date of Patent: Aug. 25, 2026

(54) SEMICONDUCTOR DEVICE AND METHOD FOR MANUFACTURING THE SEMICONDUCTOR DEVICE

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventors: Takaya Shimono, Nisshin (JP); Yohei Iwahashi, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 386 days.

(21) Appl. No.: 18/421,356

(22) Filed: Jan. 24, 2024

(65) Prior Publication Data

US 2024/0282849 A1 Aug. 22, 2024

(30) Foreign Application Priority Data

Feb. 17, 2023 (JP) ................................ 2023-023481

(51) Int. Cl.

| | |
|---|---|
| ***H10D 8/00*** | (2025.01) |
| ***H10D 8/01*** | (2025.01) |
| ***H10D 30/01*** | (2025.01) |
| ***H10D 30/66*** | (2025.01) |
| ***H10D 62/10*** | (2025.01) |
| ***H10D 84/00*** | (2025.01) |
| ***H10D 84/80*** | (2025.01) |

(52) U.S. Cl.
CPC ............ *H10D 84/141* (2025.01); *H10D 8/00* (2025.01); *H10D 8/01* (2025.01); *H10D 30/0291* (2025.01); *H10D 30/668* (2025.01); *H10D 62/127* (2025.01); *H10D 84/811* (2025.01)

(58) Field of Classification Search
CPC .... H10D 84/141; H10D 8/00; H10D 30/0291; H10D 84/811; H10D 8/01; H10D 62/127; H10D 30/668
See application file for complete search history.

(56) References Cited

U.S. PATENT DOCUMENTS

| | | | | |
|---|---|---|---|---|
| 2005/0167748 A1 | | 8/2005 | Onda et al. | |
| 2021/0384333 A1 | * | 12/2021 | Sato | H10D 12/461 |
| 2022/0406932 A1 | * | 12/2022 | Miyahara | H10D 30/668 |

FOREIGN PATENT DOCUMENTS

| | | |
|---|---|---|
| JP | 2006-324412 A | 11/2006 |

* cited by examiner

*Primary Examiner* — Afroza Chowdhury
(74) *Attorney, Agent, or Firm* — Posz Law Group, PLC

(57) ABSTRACT

A semiconductor device includes an element region having a gate switching element, and a temperature sensing region having a temperature sensing diode. The gate switching element in the element region includes gate trenches, gate electrodes and an interlayer insulating layer covering an upper surface of each of the gate electrodes in the gate trenches. The temperature sensing diode in the temperature sensing region includes an anode region, a cathode region, first dummy trenches provided in the anode region, a first insulating layer provided in each of the first dummy trenches, second dummy trenches provided in the cathode region, and a second insulating layer provided in each of the second dummy trenches.

5 Claims, 14 Drawing Sheets

FIG. 4

FIG. 7
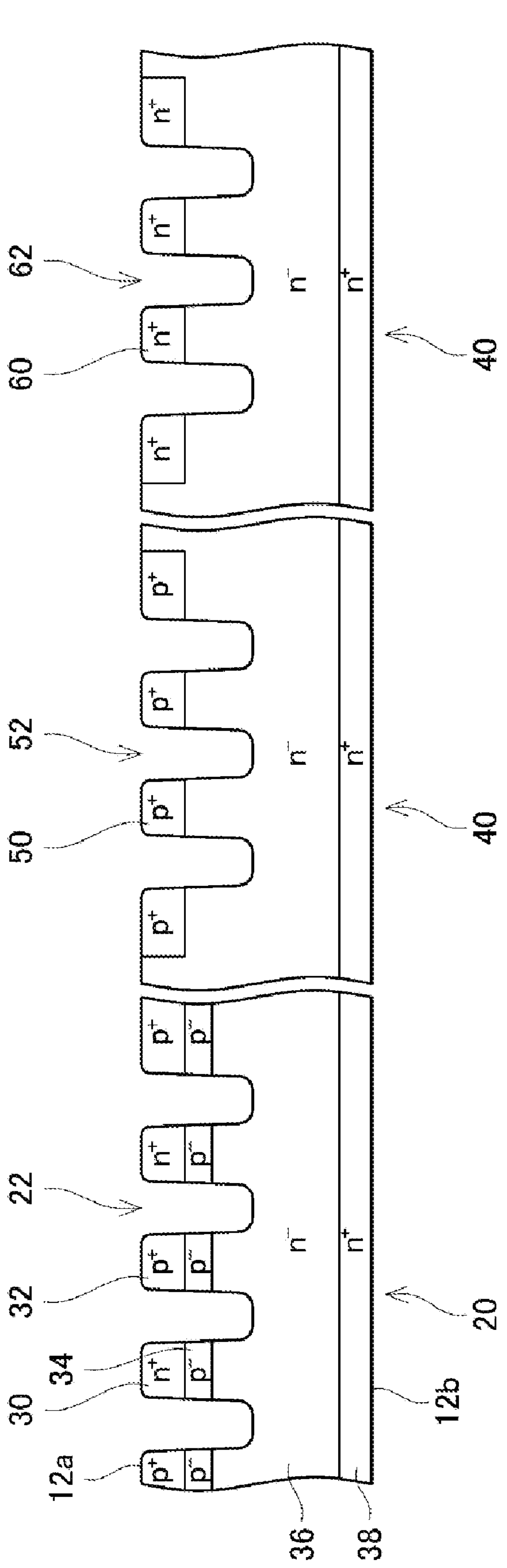
62
60
40
52
50
40
22
32
34
30
12a
20
12b
36
38
n+
n-
p+
p-

SEMICONDUCTOR DEVICE AND METHOD FOR MANUFACTURING THE SEMICONDUCTOR DEVICE

CROSS REFERENCE TO RELATED APPLICATION

The present application claims the benefit of priority from Japanese Patent Application No. 2023-023481 filed on Feb. 17, 2023. The entire disclosures of the above application are incorporated herein by reference.

TECHNICAL FIELD

The present disclosure relates to a semiconductor device and a method for manufacturing the semiconductor device.

BACKGROUND

It has been known a trench-type switching element. In the trench-type switching element, a gate electrode and an interlayer insulating layer are disposed in a gate trench formed in a semiconductor substrate. The interlayer insulating layer covers an upper surface of the gate electrode. The interlayer insulating layer may be disposed within a range below an upper end of the gate trench. That is, the interlayer insulating layer may not cover an upper surface of the semiconductor substrate. The upper surface of the semiconductor substrate may be covered with a source electrode. The interlayer insulating layer may insulate a source electrode and the gate electrode from each other.

SUMMARY

The present disclosure provides a semiconductor device including an element region having a gate switching element, and a temperature sensing region having a temperature sensing diode. The gate switching element in the element region includes gate trenches, gate electrodes and an interlayer insulating layer covering an upper surface of each of the gate electrodes. The temperature sensing diode in the temperature sensing region includes an anode region, a cathode region, first dummy trenches provided in the anode region, a first insulating layer provided in each of the first dummy trenches, second dummy trenches provided in the cathode region, and a second insulating layer provided in each of the second dummy trenches. The present disclosure also provides a method for manufacturing the semiconductor device.

BRIEF DESCRIPTION OF THE DRAWINGS

Objects, features and advantages of the present disclosure will become more apparent from the following detailed description made with reference to the accompanying drawings, in which like parts are designated by like reference numbers and in which:

FIG. 4 is a cross-sectional view of the semiconductor device including an element region, an anode region, and a cathode region;

FIG. 7 is a diagram for explaining the manufacturing method of the semiconductor device;

FIG. 9 is a diagram for explaining the manufacturing method of the semiconductor device;

FIG. 12 is a diagram for explaining a manufacturing method of a semiconductor device as a comparative example;

DETAILED DESCRIPTION

Figure 1:
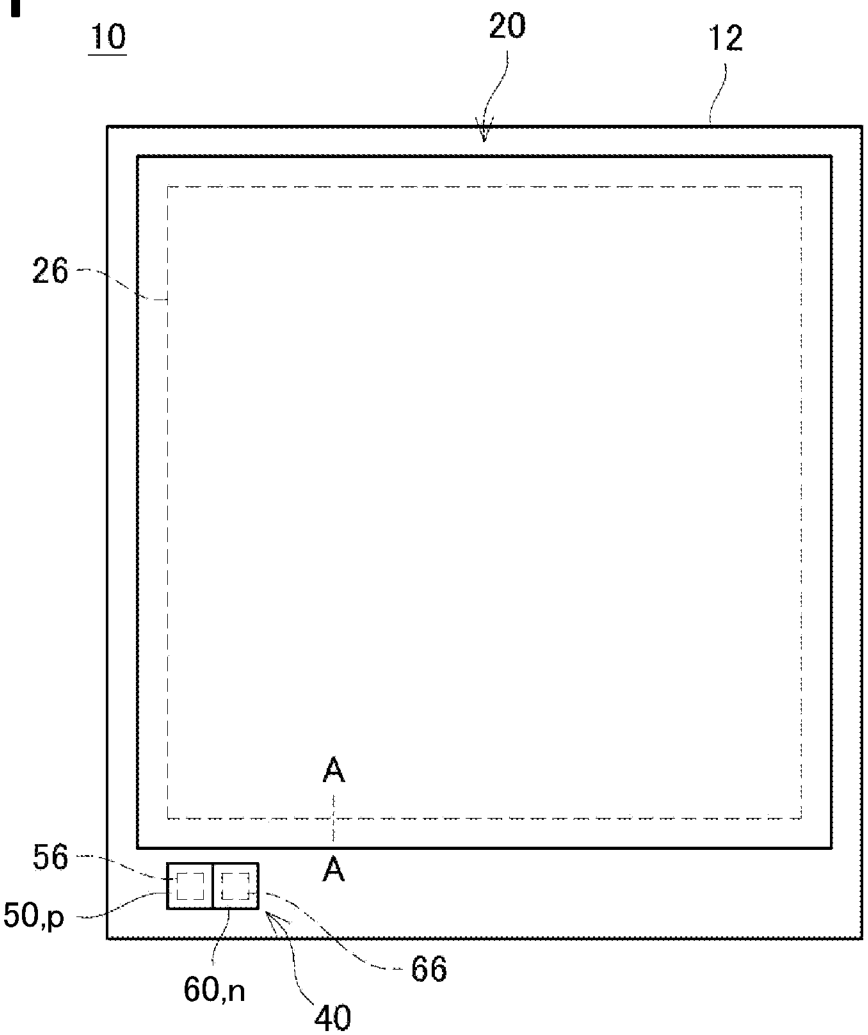
FIG. 1 is a plan view of a semiconductor device.

To begin with, a relevant technology will be described only for understanding the embodiments of the present disclosure.

It has been known a trench-type switching element in which a gate electrode and an interlayer insulating layer are disposed in a gate trench formed in a semiconductor substrate. The interlayer insulating layer covers an upper surface of the gate electrode. The interlayer insulating layer is disposed within a range below an upper end of the gate trench. That is, the interlayer insulating layer does not cover an upper surface of the semiconductor substrate. The upper surface of the semiconductor substrate is covered with a source electrode. The interlayer insulating layer insulates a source electrode and the gate electrode from each other. In a manufacturing process of such a switching element, after the gate electrode is formed in the gate trench, an insulating layer is formed on the upper surface of the semiconductor substrate. Next, the insulating layer is etched to expose the upper surface of the semiconductor substrate. At this time, the insulating layer is left in the gate trench. The insulating layer remaining in the gate trench serves as the interlayer insulating layer. According to this manufacturing method, since the interlayer insulating layer is formed in the gate trench in a self-aligned manner, it is not necessary to control the formation position of the interlayer insulating layer. Therefore, the interval between the gate trenches can be narrowed, and the switching element can be highly integrated.

In a semiconductor device, for example, a temperature sensing diode may be formed on the same semiconductor substrate in which a trench-type switching element is formed. The temperature sensing diode detects the temperature of the switching element. Hereinafter, in the semiconductor substrate, a region corresponding to the switching element may be referred to as an element region, and a region corresponding to the temperature sensing diode may be referred to as a temperature sensing region. In a manufacturing process of the semiconductor device having the switching element and the temperature sensing diode, when an insulating layer is formed on an upper surface of a semiconductor substrate, the insulating layer becomes thicker in a temperature sensing region than in the element region. Thereafter, the insulating layer is etched to form contact holes in the element region and the temperature sensing region. In the element region, the contact hole is formed so that the insulating layer (that is, the interlayer insulating layer) remains in the gate trench. When each contact hole is formed in this manner, the insulating layer in the temperature sensing region is thick, and thus the upper surface of the semiconductor substrate may not be exposed in the contact hole formed in the temperature sensing region. In this case, an electrode in contact with the temperature sensing region cannot be appropriately formed. On the contrary, when the etching time of the insulating layer is increased, the upper surface of the semiconductor substrate can be exposed from the insulating layer in the temperature sensing region, but the thickness of the interlayer insulating layer remaining in the gate trench in the element region is reduced. Therefore, the dielectric breakdown voltage of the interlayer insulating layer decreases. As such, in the semiconductor device having the switching element and the temperature sensing diode, it is difficult to form the interlayer insulating layer in a self-aligned manner. The present disclosure provides a technique for suitably forming an interlayer insulating layer in a semiconductor device having a switching element and a temperature sensing diode.

According to an aspect of the present disclosure, a semiconductor device includes a semiconductor substrate having an element region provided with a gate-type switching element and a temperature sensing region provided with a temperature sensing diode. The gate-type switching element includes a plurality of gate trenches provided in an upper surface of the semiconductor substrate, a gate electrode disposed in each of the gate trenches, and an interlayer insulating layer disposed in each of the gate trenches in a range lower than an upper end of the corresponding gate trench and covering an upper surface of the corresponding gate electrode. The temperature sensing diode includes a p-type anode region, an n-type cathode region in contact with the anode region, a plurality of first dummy trenches provided in the upper surface of the semiconductor substrate in the anode region, a first insulating layer disposed in each of the first dummy trenches and in a range lower than an upper end of the corresponding first dummy trench, a plurality of second dummy trenches provided in the upper surface of the semiconductor substrate in the cathode region, and a second insulating layer disposed in each of the second dummy trenches and in a range lower than an upper end of the corresponding second dummy trench. The semiconductor device further includes a surface insulating layer, a source contact hole, a source electrode, an anode contact hole, an anode electrode, a cathode contact hole and a cathode electrode. The surface insulating layer covers the upper surface of the semiconductor substrate. The source contact hole is provided in the surface insulating layer and located above the element region. The source electrode is disposed in the source contact hole and in contact with the interlayer insulating layer in each of the gate trenches and the upper surface of the semiconductor substrate. The anode contact hole is provided in the surface insulating layer and located above the anode region. The anode electrode is disposed in the anode contact hole and in contact with the first insulating layer in each of the first dummy trenches and the anode region. The cathode contact hole is provided in the surface insulating layer and located above the cathode region. The cathode electrode is disposed in the cathode contact hole and in contact with the second insulating layer in each of the second dummy trenches and the cathode region.

It has been found that when an insulating layer is formed on the upper surface of the semiconductor substrate, the thickness of the insulating layer changes due to the influence of the trench. That is, in the region where the trench is provided in the upper surface of the semiconductor substrate, the insulating layer is formed not only on the upper surface of the semiconductor substrate but also inside the trench. As a result, the thickness of the insulating layer is reduced on the upper surface of the semiconductor substrate. On the other hand, in the region where the trench is not provided in the upper surface of the semiconductor substrate, the thickness of the insulating layer on the upper surface of the semiconductor substrate is larger than that in the region where the trench is provided. In the semiconductor device according to the aspect described above, the gate trenches are provided in the element region, and the first dummy trenches and the second dummy trenches are provided in the temperature sensing region. Therefore, when the insulating layer is formed in the element region and the temperature sensing region, a difference in thickness of the insulating layer can be suppressed. Accordingly, in a process for manufacturing such a semiconductor device, the interlayer insulating layer can be suitably formed.

The present disclosure provides a method for manufacturing a semiconductor device having a gate-type switching element and a temperature sensing diode. According to an aspect of the present disclosure, a method for manufacturing a semiconductor device includes: processing a semiconductor substrate; forming an insulating layer; forming contact holes; and forming electrodes. The processing of the semiconductor substrate includes steps of: forming a plurality of gate trenches of the gate switching element in an upper surface of the semiconductor substrate; forming a gate electrode in each of the plurality of gate trenches in a range lower than an upper end of each of the plurality of gate trenches; forming a p-type anode region and an n-type cathode region of the temperature sensing diode in the semiconductor substrate; forming a plurality of first dummy trenches in the upper surface of the semiconductor substrate in the anode region; and forming a plurality of second dummy trenches in the upper surface of the semiconductor substrate in the cathode region. In the forming of the insulating layer, the insulating layer is formed over the upper surface of the semiconductor substrate so that the plurality of gate trenches, the plurality of first dummy trenches and the plurality of second dummy trenches are filled with the insulating layer. In the forming of the contact holes, as the contact holes, a source contact hole, an anode contact hole and a cathode contact hole are formed in the insulating layer by etching. The forming of the source contact hole, the anode contact hole and the cathode contact hole are performed so as to satisfy following conditions in which: the plurality of gate trenches are located in the source contact hole; the upper surface of the semiconductor substrate is exposed in the source contact hole; the insulating layer remains in each of the plurality of gate trenches located in the source contact hole in a range lower than an upper end of each of the plurality of gate trenches in a state of covering an upper surface of each of the gate electrodes; the plurality of first dummy trenches are located in the anode contact hole; the upper surface of the semiconductor substrate is exposed in the anode contact hole; the insulating layer remains in each of the plurality of first dummy trenches located in the anode contact hole in a range lower than an upper end of each of the plurality of first dummy trenches; the plurality of second dummy trenches are located in the cathode contact hole; the upper surface of the semiconductor substrate is exposed in the cathode contact hole; and the insulating layer remains in each of the plurality of second dummy trenches located in the cathode contact hole in a range lower than an upper end of each of the plurality of second dummy trenches. In the forming of the electrodes, as the electrodes, a source electrode, an anode electrode, and a cathode electrode are formed. The source electrode is formed in the source contact hole to be in contact with the insulating layer in each of the plurality of gate trenches and the upper surface of the semiconductor substrate exposed in the source contact hole. The anode electrode is formed in the anode contact hole to be in contact with the insulating layer in each of the plurality of first dummy trenches and the anode region, and the cathode electrode is formed in the cathode contact hole to be in contact with the insulating layer in each of the plurality of second dummy trenches and the cathode region.

In the processing of the semiconductor substrate, the respective steps may be performed in any order. Further, in the processing of the semiconductor substrate, two or more of the respective steps may be simultaneously performed. In the forming of the contact holes, the source contact hole, the anode contact hole, and the cathode contact hole may be formed simultaneously, or may be formed separately. In the forming of the electrodes, the source electrode, the anode electrode, and the cathode electrode may be formed simultaneously, or may be formed separately.

In the manufacturing method described above, since the insulating layer is formed in a state in which the gate trenches, the first dummy trenches, and the second dummy trenches are present in the upper surface of the semiconductor substrate, it is possible to suppress the occurrence of a difference in thickness of the insulating layer when the insulating layer is formed in the element region and the temperature sensing region. Accordingly, in the manufacturing method described above, the interlayer insulating layer can be suitably formed.

According to another aspect of the present disclosure, in the method for manufacturing the semiconductor device, a width of the first dummy trench and a width of the second dummy trench may be equal to a width of the gate trench. According to further another aspect of the present disclosure, in the method for manufacturing the semiconductor device, a pitch of the first dummy trench and a pitch of the second dummy trench may be equal to a pitch of the gate trench.

The term "equal" means that a difference between two target values is equal to or less than a manufacturing error.

According to the configurations described above, it is possible to more effectively suppress the occurrence of a difference in the thickness of the insulating layer between the element region and the temperature sensing region.

According to further another aspect of the present disclosure, in the method for manufacturing the semiconductor device, the gate trench, the first dummy trench, and the second dummy trench may be formed simultaneously.

According to further another aspect of the present disclosure, in the method for manufacturing the semiconductor device, the processing of the semiconductor substrate may further include: forming a first dummy electrode in each of the first dummy trenches in a range below an upper end of the corresponding first dummy trench; and forming a second dummy electrode in each of the second dummy trenches in a range below an upper end of the corresponding second dummy trench. The gate electrode, the first dummy electrode, and the second dummy electrode may be simultaneously formed.

An embodiment of the present disclosure will be described hereinafter with reference to the drawings.

Figure 2:
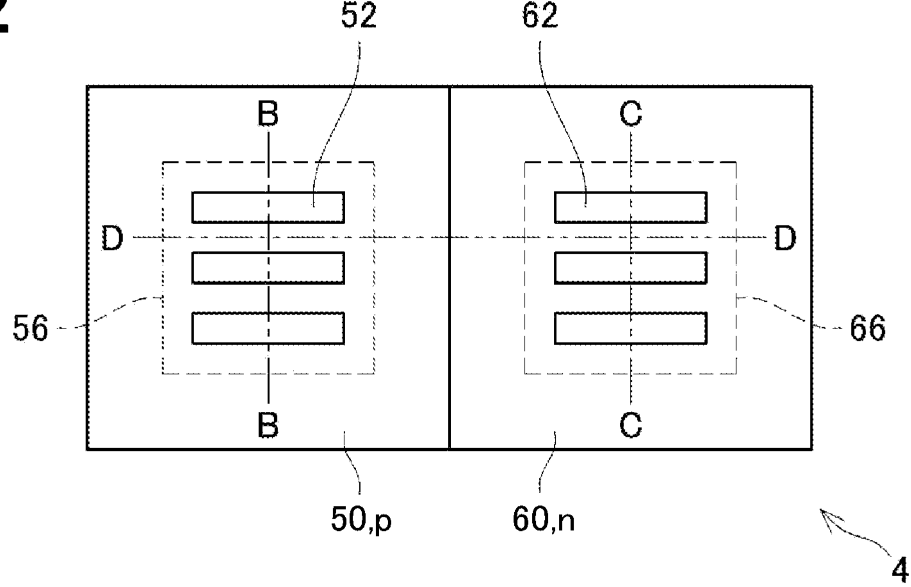
FIG. 2 is an enlarged plan view of a temperature sensing region of the semiconductor device shown in FIG. 1.
Figure 3:
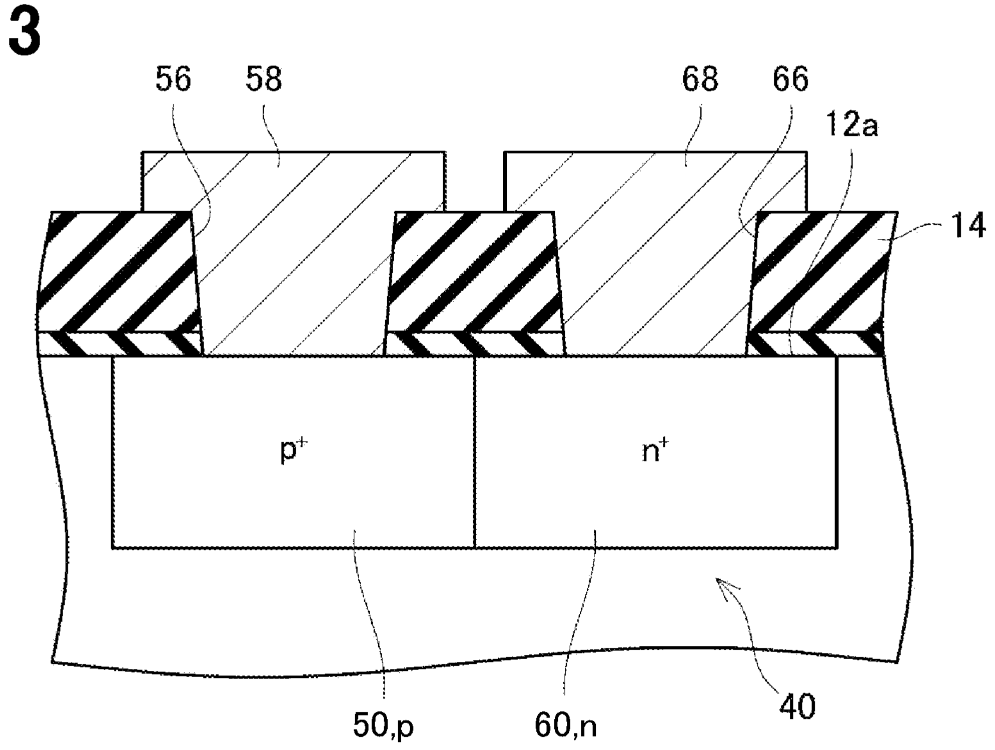
FIG. 3 is a cross-sectional view of the temperature sensing region.

A semiconductor device 10 according to an embodiment of the present disclosure includes a semiconductor substrate 12, as shown in FIG. 1. When viewed from the top, the semiconductor substrate 12 has an element region 20 and a temperature sensing region 40. The element region 20 is provided with a gate-type switching element. The temperature sensing region 40 is provided with a temperature sensing diode. As shown in FIGS. 1 and 2, the temperature sensing diode has a p-type anode region 50 and an n-type cathode region 60. As shown in FIG. 3, the anode region 50 and the cathode region 60 are each disposed in the semiconductor substrate 12 in a range including the upper surface 12*a* of the semiconductor substrate 12. The anode region 50 and the cathode region 60 are in contact with each other.

Figure 4:
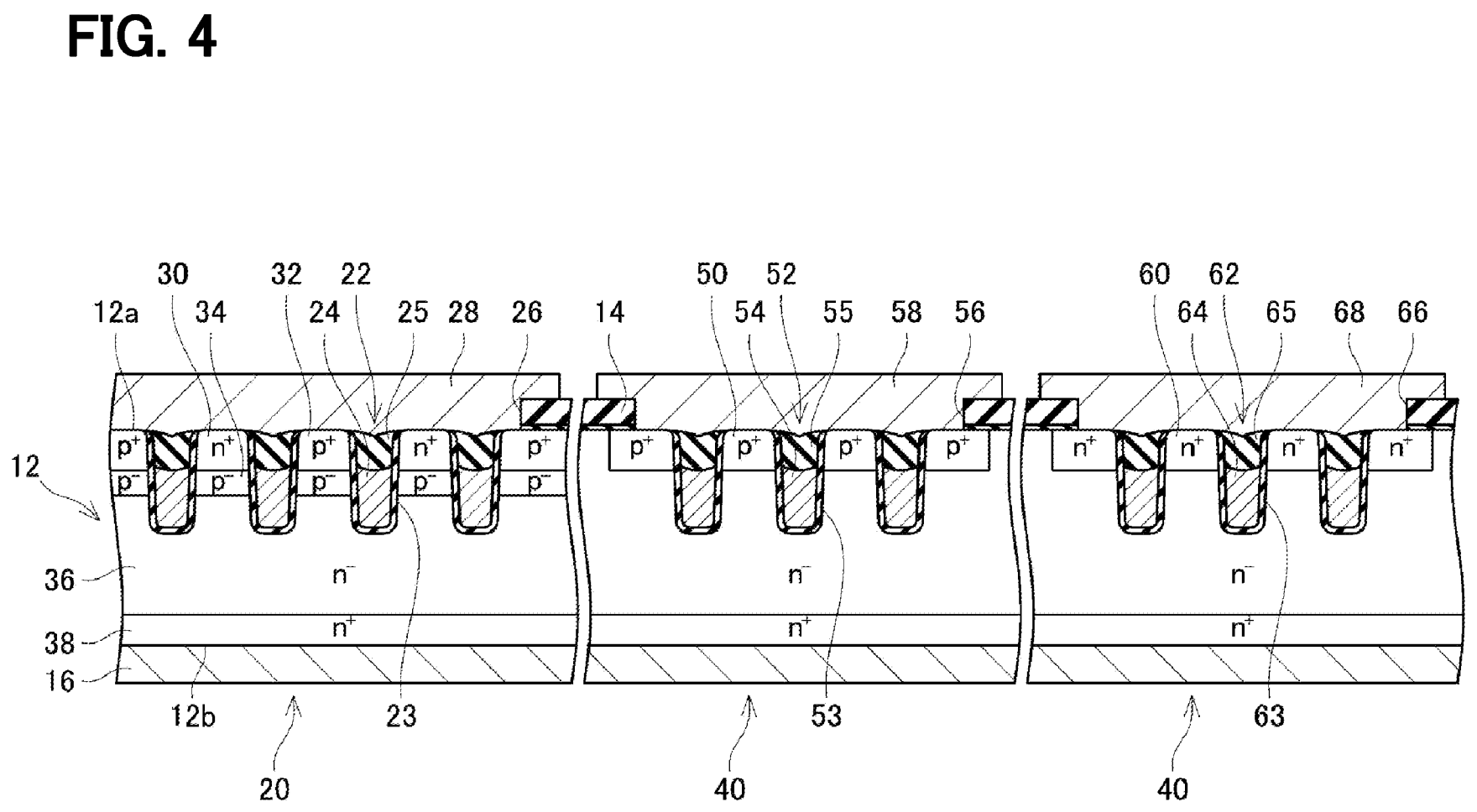

FIG. 4 shows a cross section of the semiconductor device including the element region 20, the anode region 50, and the cathode region 60. In FIGS. 4 to 11, the left drawing shows a cross section taken along a line A-A of FIG. 1, the center drawing shows a cross section taken along a line B-B of FIG. 2, and the right drawing shows a cross section taken along a line C-C of FIG. 2. As shown in FIG. 4, a surface insulating layer 14 is provided on the upper surface 12*a* of the semiconductor substrate 12. As shown in FIGS. 1 and 2, the surface insulating layer 14 is formed with a source contact hole 26, an anode contact hole 56, and a cathode contact hole 66. The source contact hole 26 is provided above the element region 20. The anode contact hole 56 is provided above the anode region 50. The cathode contact hole 66 is provided above the cathode region 60.

A source electrode 28 is provided in the source contact hole 26. The source electrode 28 is in contact with the upper surface 12*a* of the semiconductor substrate 12 in the source contact hole 26. An anode electrode 58 is provided in the anode contact hole 56. The anode electrode 58 is in contact with the upper surface 12*a* of the semiconductor substrate 12 (i.e., the anode region 50) in the anode contact hole 56. A cathode electrode 68 is provided in the cathode contact hole 66. The cathode electrode 68 is in contact with the upper surface 12*a* of the semiconductor substrate 12 (i.e., the cathode region 60) in the cathode contact hole 66. A drain electrode 16 is provided on the lower surface 12*b* of the semiconductor substrate 12. The drain electrode 16 is in contact with substantially the entire lower surface 12*b*.

A plurality of gate trenches 22 are provided in the upper surface 12*a* of the semiconductor substrate 12 in the element region 20. The gate trenches 22 are provided in the source contact hole 26. The gate trenches 22 extend in parallel in the upper surface 12*a*. The inner surface of each gate trench 22 is covered with a gate insulating film 23. A gate electrode 24 is disposed in each gate trench 22. The gate electrode 24 is insulated from the semiconductor substrate 12 by the gate insulating film 23. An interlayer insulating layer 25 is disposed in the gate trench 22 and above the gate electrode 24. The interlayer insulating layer 25 covers the upper surface of the gate electrode 24. The interlayer insulating layer 25 is disposed within a range below the upper end of the gate trench 22. Therefore, the interlayer insulating layer 25 is not in contact with the upper surface 12*a* of the semiconductor substrate 12. The source electrode 28 is in contact with an upper surface of the interlayer insulating layer 25. The interlayer insulating layer 25 insulates the gate electrode 24 from the source electrode 28.

A source region 30, a contact region 32, and a body region 34 are provided inside the semiconductor substrate 12 in the element region 20. The source region 30 is an n-type region having a high n-type impurity concentration. The contact region 32 is a p-type region having a high p-type impurity concentration. The source region 30 and the contact region 32 are disposed in a range including the upper surface 12*a* of the semiconductor substrate 12. The source region 30 and the contact region 32 are in contact with the source electrode 28. The source region 30 and the contact region 32 are arranged in a range sandwiched between two gate trenches 22 (hereinafter referred to as an inter-trench range). In each inter-trench range, the source region 30 and the contact region 32 are alternately arranged along a direction parallel to the gate trench 22. The source region 30 and the contact region 32 are in contact with the gate insulating film 23 on the side surface of the gate trench 22. The source region 30 has substantially the same thickness as the cathode region 60. The contact region 32 has substantially the same thickness as the anode region 50. The body region 34 is a p-type region having a p-type impurity concentration lower than that of the contact region 32. The body region 34 is in contact with the bottom of the source region 30 and the bottom of the contact region 32. The body region 34 is in contact with the gate insulating film 23 below the source region 30 and the contact region 32.

A drift region 36 is provided below the body region 34. The drift region 36 is an n-type region having an n-type impurity concentration lower than that of the source region 30. The drift region 36 is in contact with the bottom of the body region 34. The drift region 36 is in contact with the gate insulating films 23 at positions below the body region 34. The drift region 36 is distributed over the element region 20 and the temperature sensing region 40. The drift region 36 is in contact with the bottom of the anode region 50 and the bottom of the cathode region 60 in the temperature sensing region 40.

A drain region 38 is provided below the drift region 36. The drain region 38 is an n-type region having a higher n-type impurity concentration than the drift region 36. The drain region 38 is distributed over the element region 20 and the temperature sensing region 40. The drain region 38 is in contact with the bottom of the drift region 36 in the element region 20 and the temperature sensing region 40. The drain region 38 is in contact with the drain electrode 16 in the element region 20 and the temperature sensing region 40.

As shown in FIGS. 2 and 4, a plurality of dummy trenches 52 are provided in the upper surface 12*a* of the semiconductor substrate 12 in the anode region 50. The dummy trenches 52 extend parallel to each other. The dummy trenches 52 are disposed in the anode contact hole 56. Each dummy trench 52 has substantially the same depth as the gate trench 22. Each dummy trench 52 extends from the upper surface 12*a* to the drift region 36 through the anode region 50. The width of the dummy trench 52 is equal to the width of the gate trench 22. Further, the pitch of the dummy trenches 52 (i.e., the interval between the center lines of the two dummy trenches 52) is equal to the pitch of the gate trenches 22.

The inner surface of the dummy trench 52 is covered with an insulating film 53. A dummy electrode 54 is disposed in the dummy trench 52. The dummy electrode 54 is insulated from the semiconductor substrate 12 by the insulating film 53. An insulating layer 55 is disposed in the dummy trench 52 and above the dummy electrode 54. The insulating layer 55 covers the upper surface of the dummy electrode 54. The insulating layer 55 is disposed within a range below the upper end of the dummy trench 52. Therefore, the insulating layer 55 is not in contact with the upper surface 12*a* of the semiconductor substrate 12.

As shown in FIGS. 2 and 4, a plurality of dummy trenches 62 are provided in the upper surface 12*a* of the semiconductor substrate 12 in the cathode region 60. The dummy trenches 62 extend parallel to each other. The dummy trenches 62 are disposed in the cathode contact hole 66. Each dummy trench 62 has substantially the same depth as the gate trench 22. Each dummy trench 62 extends from the upper surface 12*a* to the drift region 36 through the cathode region 60. The width of the dummy trench 62 is equal to the width of the gate trench 22. The pitch of the dummy trenches 62 is equal to the pitch of the gate trenches 22.

The inner surface of the dummy trench 62 is covered with an insulating film 63. A dummy electrode 64 is disposed in the dummy trench 62. The dummy electrode 64 is insulated from the semiconductor substrate 12 by the insulating film 63. An insulating layer 65 is disposed in the dummy trench 62 and above the dummy electrode 64. The insulating layer 65 covers the upper surface of the dummy electrode 64. The insulating layer 65 is disposed within a range below the upper end of the dummy trench 62. Therefore, the insulating layer 65 is not in contact with the upper surface 12*a* of the semiconductor substrate 12.

In the element region 20, a metal-oxide-semiconductor field effect transistor (MOSFET) is formed by the source region 30, the contact region 32, the body region 34, the drift region 36, the drain region 38, the gate electrode 24, the source electrode 28, the drain electrode 16, and the like. In the temperature sensing region 40, a pn diode is formed by the anode region 50, the cathode region 60, the anode electrode 58, and the cathode electrode 68. The forward voltage drop of the pn diode changes depending on the temperature of the semiconductor substrate 12. Therefore, the temperature of the semiconductor substrate 12 can be detected using the pn diode. Since the temperature sensing region 40 is disposed next to the element region 20, the temperature of the MOSFET can be detected by the pn diode.

Figure 5:
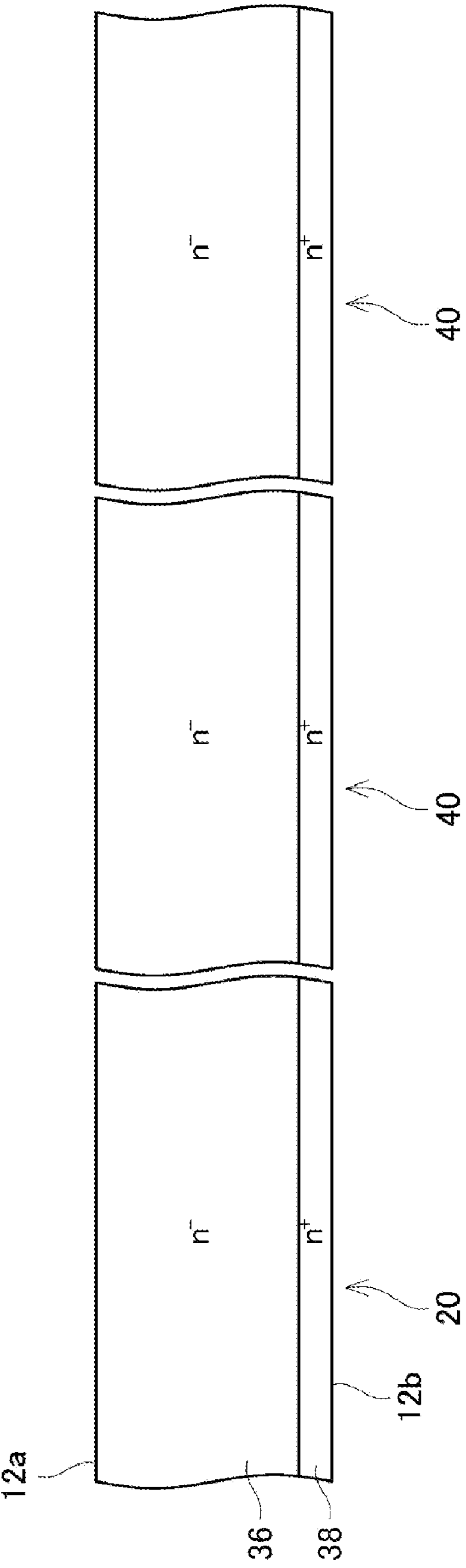
FIG. 5 is a diagram for explaining a manufacturing method of the semiconductor device.

Next, a manufacturing method of the semiconductor device 10 will be described. FIG. 5 shows the semiconductor substrate 12 before processing. The semiconductor substrate 12 before processing has the drain region 38 and the drift region 36. The manufacturing method of the semiconductor device 10 includes a semiconductor substrate processing process, an insulating layer forming process, a contact hole forming process, and an electrode forming process.

(Semiconductor Substrate Processing Process)

Figure 6:
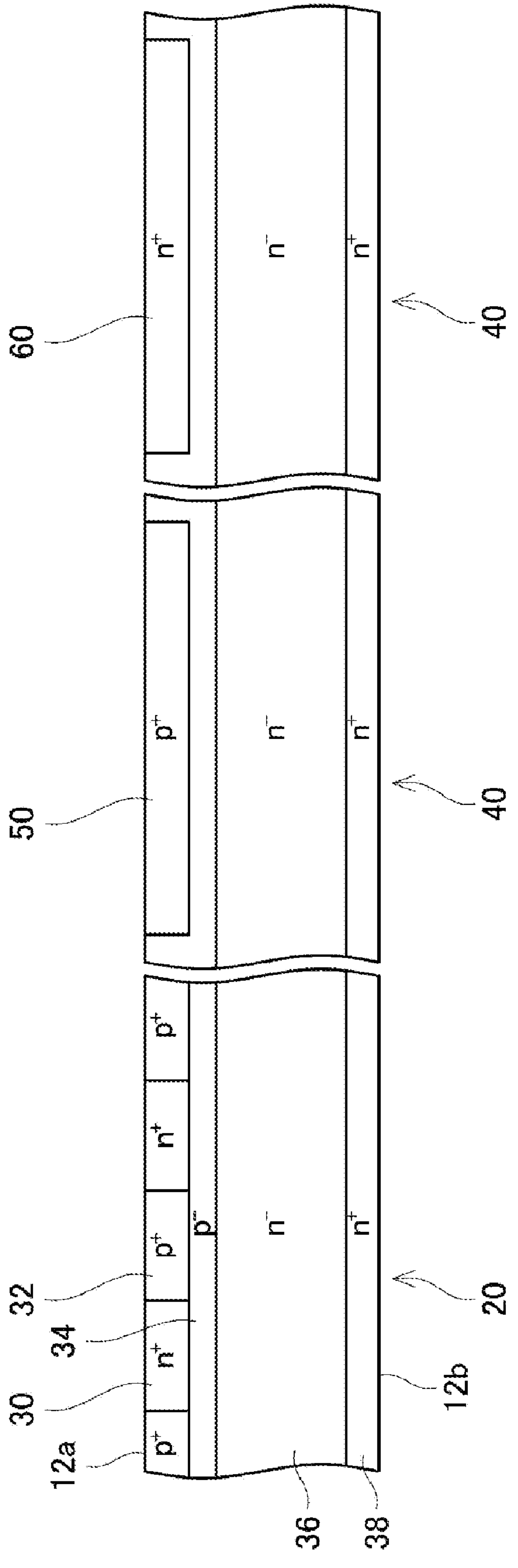
FIG. 6 is a diagram for explaining the manufacturing method of the semiconductor device.

First, as shown in FIG. 6, a p-type impurity is selectively implanted into the upper surface 12*a* of the semiconductor substrate 12 to form the body region 34 in the element region 20. Next, a p-type impurity is selectively implanted into the upper surface 12*a* of the semiconductor substrate 12 to form the contact region 32 and the anode region 50. That is, the contact region 32 and the anode region 50 are simultaneously formed. In another embodiment, the contact region 32 and the anode region 50 may be formed in separate processes. Next, an n-type impurity is selectively implanted into the upper surface 12*a* of the semiconductor substrate 12 to form the source region 30 and the cathode region 60. That is, the source region 30 and the cathode region 60 are simultaneously formed. In another embodiment, the source region 30 and the cathode region 60 may be formed in separate processes.

Next, as shown in FIG. 7, the upper surface 12*a* of the semiconductor substrate 12 is selectively etched to form the gate trench 22, the dummy trench 52, and the dummy trench 62. The gate trench 22 is formed to penetrate the body region 34 and reach the drift region 36. The dummy trench 52 is formed to penetrate the anode region 50 and reach the drift region 36. The dummy trench 62 is formed to penetrate the cathode region 60 and reach the drift region 36.

Figure 8:
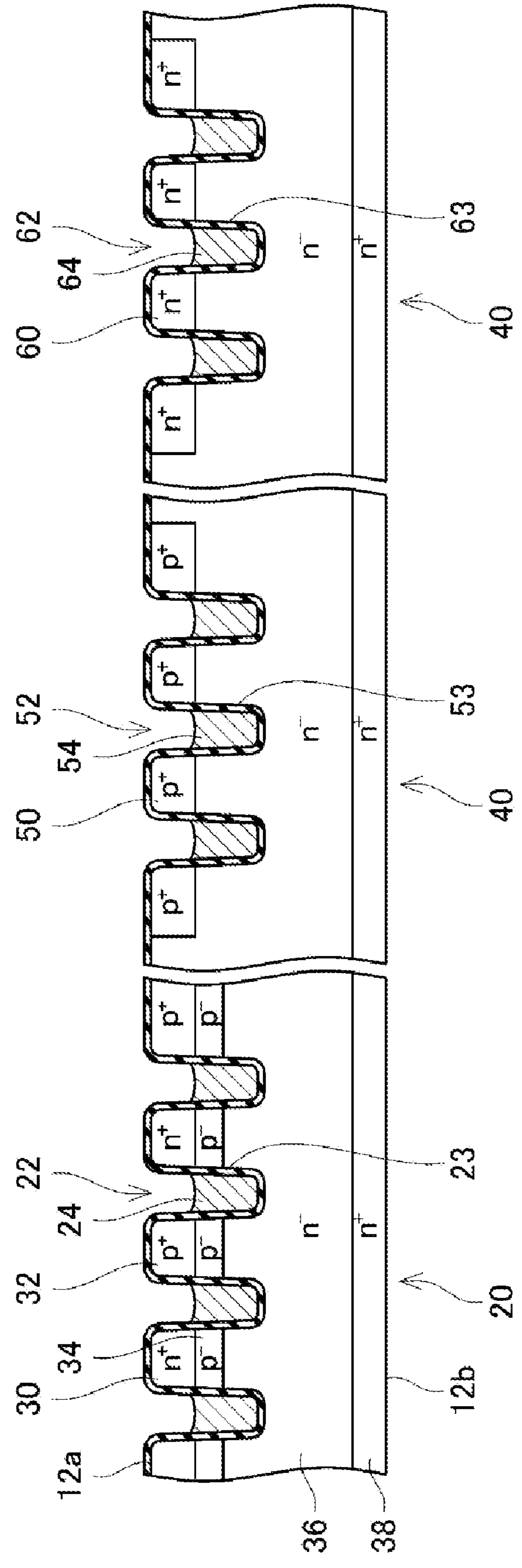
FIG. 8 is a diagram for explaining the manufacturing method of the semiconductor device.

Next, as shown in FIG. 8, a thin insulating film covering the inner surfaces of the gate trench 22, the dummy trench 52, and the dummy trench 62 is formed by thermal oxidation. The insulating film formed in the gate trench 22 is the gate insulating film 23. The insulating film formed in the dummy trench 52 is the insulating film 53, and the insulating film formed in the dummy trench 62 is the insulating film 63. Here, the thin insulating film is also formed on the upper surface 12*a* of the semiconductor substrate 12. Next, the gate electrode 24, the dummy electrode 54, and the dummy electrode 64 are formed in the gate trench 22, the dummy trench 52, and the dummy trench 62, respectively. More specifically, first, a polysilicon layer is formed on the semiconductor substrate 12 so as to fill the gate trenches 22, the dummy trenches 52, and the dummy trenches 62. Next, the polysilicon layer is etched to remove the polysilicon layer on the upper surface 12*a* and the upper portions of the respective trenches. The polysilicon layer is left in the lower portions of the respective trenches. The polysilicon layer left in the gate trench 22 becomes the gate electrode 24, the polysilicon layer left in the dummy trench 52 becomes the dummy electrode 54, and the polysilicon layer left in the dummy trench 62 becomes the dummy electrode 64.

(Insulating Layer Forming Process)

Figure 9:
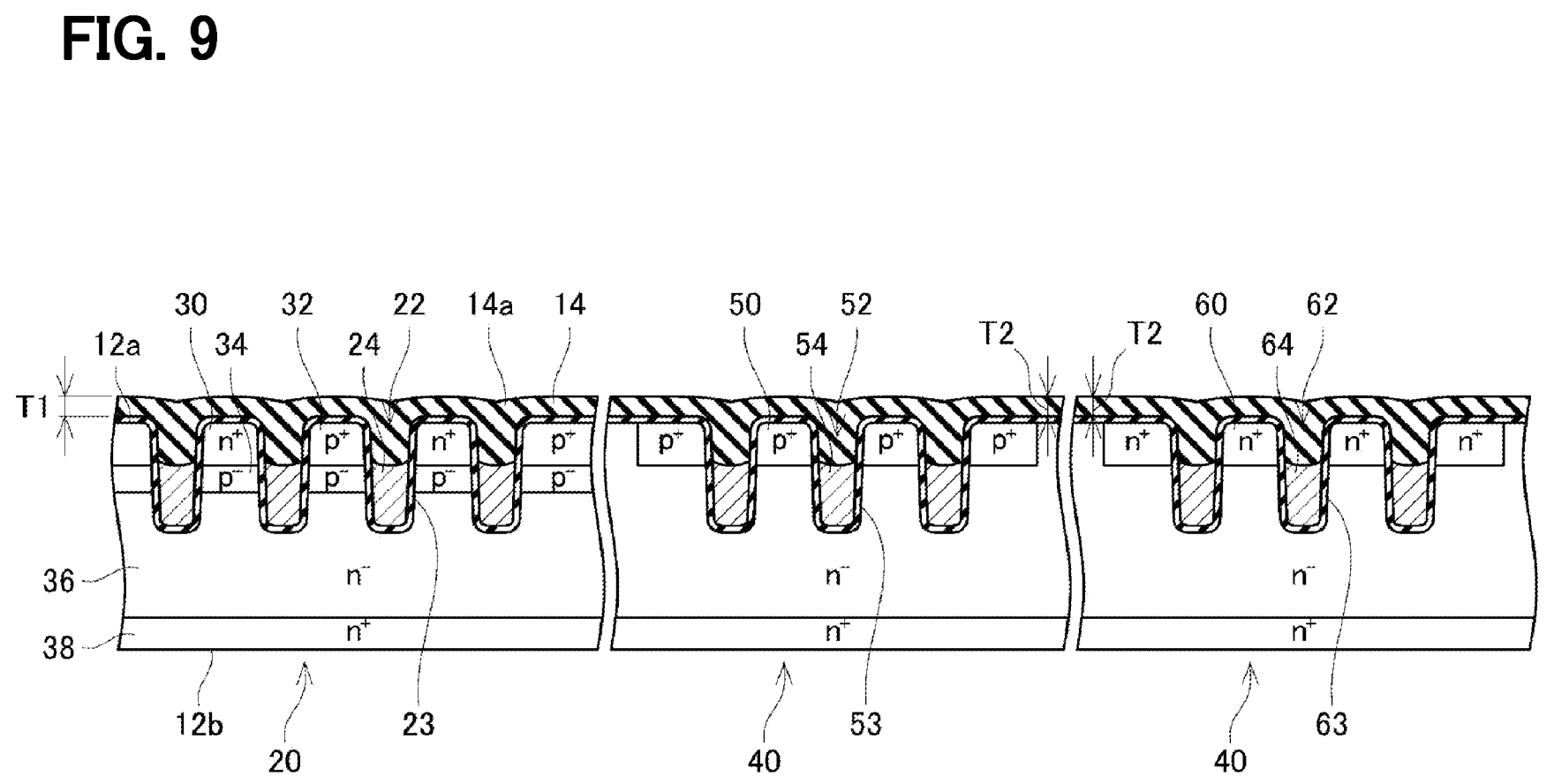

Next, as shown in FIG. 9, a thick insulating layer 14*a* is formed on the semiconductor substrate 12 by chemical vapor deposition (CVD). A portion of the insulating layer 14*a* covering the upper surface 12*a* is the surface insulating layer 14. The gate trench 22, the dummy trench 52, and the dummy trench 62 are filled with the insulating layer 14*a*. In the gate trench 22, the insulating layer 14*a* covers the upper surface of the gate electrode 24. In the dummy trench 52, the insulating layer 14*a* covers the upper surface of the dummy electrode 54. In the dummy trench 62, the insulating layer 14*a* covers the upper surface of the dummy electrode 64.

(Contact Hole Forming Process)

Figure 10:
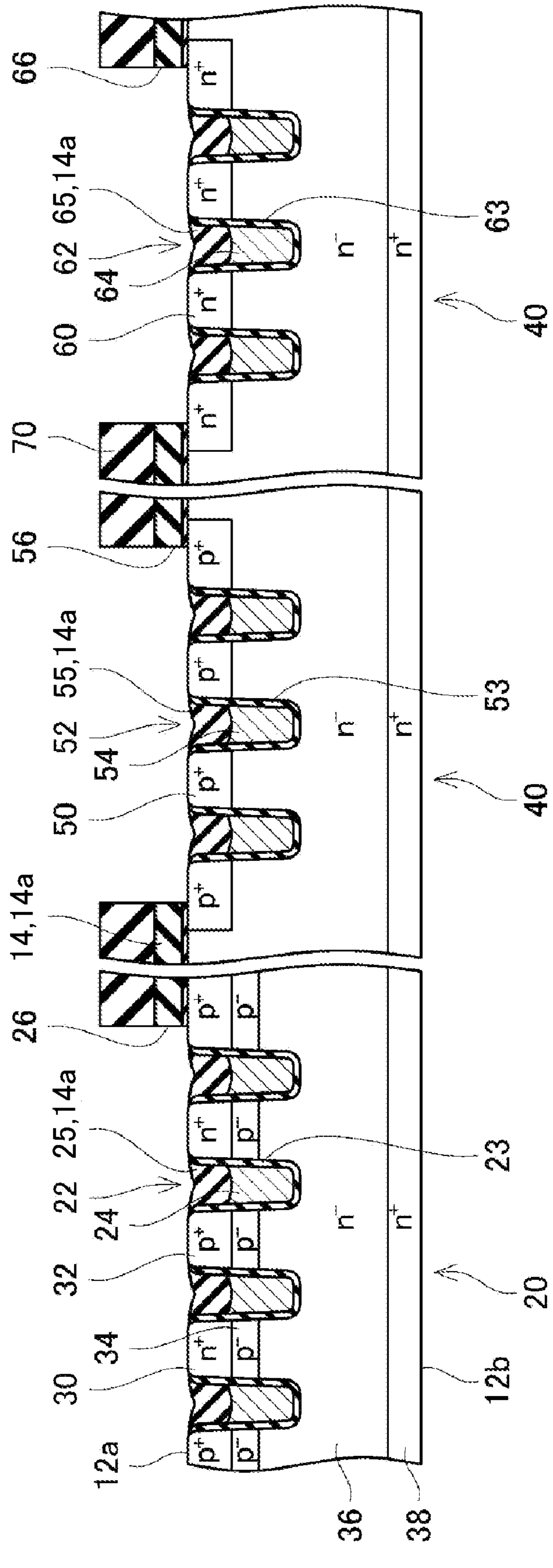
FIG. 10 is a diagram for explaining the manufacturing method of the semiconductor device.

Next, as shown in FIG. 10, a mask layer 70 is formed on the insulating layer 14*a*, and the insulating layer 14*a* is partially etched through the mask layer 70. Thus, the contact holes 26, 56, and 66 are formed in the insulating layer 14*a*. In the source contact hole 26, the insulating layer 14*a* above the upper surface 12*a* is removed to expose the upper surface 12*a*. The plurality of gate trenches 22 are arranged in the source contact hole 26. In the source contact hole 26, the insulating layer 14*a* is left in each gate trench 22 such that the upper end of the insulating layer 14*a* remaining in the gate trench 22 is located in a range lower than the upper end (i.e., the upper surface 12*a*) of the gate trench 22. The insulating layer 14*a* remaining in the gate trench 22 covers the upper surface of the gate electrode 24. The insulating layer 14*a* remaining in the gate trench 22 serves as the interlayer insulating layer 25. In the anode contact hole 56, the insulating layer 14*a* on the upper surface 12*a* is removed to expose the upper surface 12*a*. The plurality of dummy trenches 52 are arranged in the anode contact hole 56. In the anode contact hole 56, the insulating layer 14*a* is left in each dummy trench 52 such that the upper end of the insulating layer 14*a* remaining in the dummy trench 52 is located in a range lower than the upper end (i.e., the upper surface 12*a*) of the dummy trench 52. The insulating layer 14*a* remaining in the dummy trench 52 serves as the insulating layer 55. In the cathode contact hole 66, the insulating layer 14*a* on the upper surface 12*a* is removed to expose the upper surface 12*a*. The plurality of dummy trenches 62 are arranged in the cathode contact hole 66. In the cathode contact hole 66, the insulating layer 14*a* is left in the dummy trench 62 such that the upper end of the insulating layer 14*a* remaining in the dummy trench 62 is located in a range lower than the upper end (i.e., the upper surface 12*a*) of the dummy trench 62. The insulating layer 14*a* remaining in the dummy trench 62 serves as the insulating layer 65.

(Electrode Forming Process)

Figure 11:
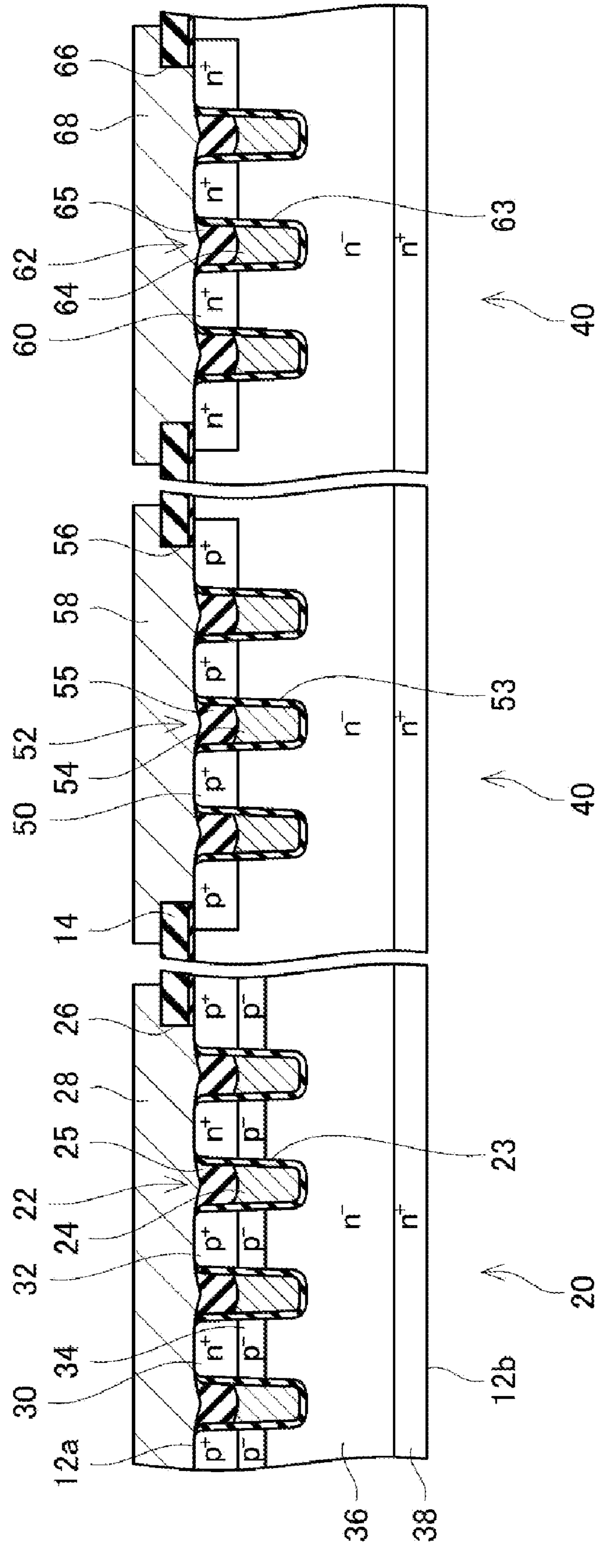
FIG. 11 is a diagram for explaining the manufacturing method of the semiconductor device.

Next, as shown in FIG. 11, the source electrode 28, the anode electrode 58, and the cathode electrode 68 are formed. More specifically, first, a metal layer is formed on the surface insulating layer 14 so as to fill the contact holes 26, 56, and 66. Next, the metal layer on the surface insulating layer 14 is etched to separate the metal layer in the source contact hole 26, the metal layer in the anode contact hole 56, and the metal layer in the cathode contact hole 66 from each other. The metal layer in the source contact hole 26 serves as the source electrode 28, the metal layer in the anode contact hole 56 serves as the anode electrode 58, and the metal layer in the cathode contact hole 66 serves as the cathode electrode 68. The source electrode 28 is in contact with each interlayer insulating layer 25 and the upper surface 12*a* of the semiconductor substrate 12. The anode electrode 58 is in contact with each insulating layer 55 and the anode region 50. The cathode electrode 68 is in contact with each insulating layer 65 and the cathode region 60.

Next, the drain electrode 16 is formed on the lower surface 12*b* of the semiconductor substrate 12. In this way, the semiconductor device 10 shown in FIGS. 1 to 4 is produced.

Figure 12:
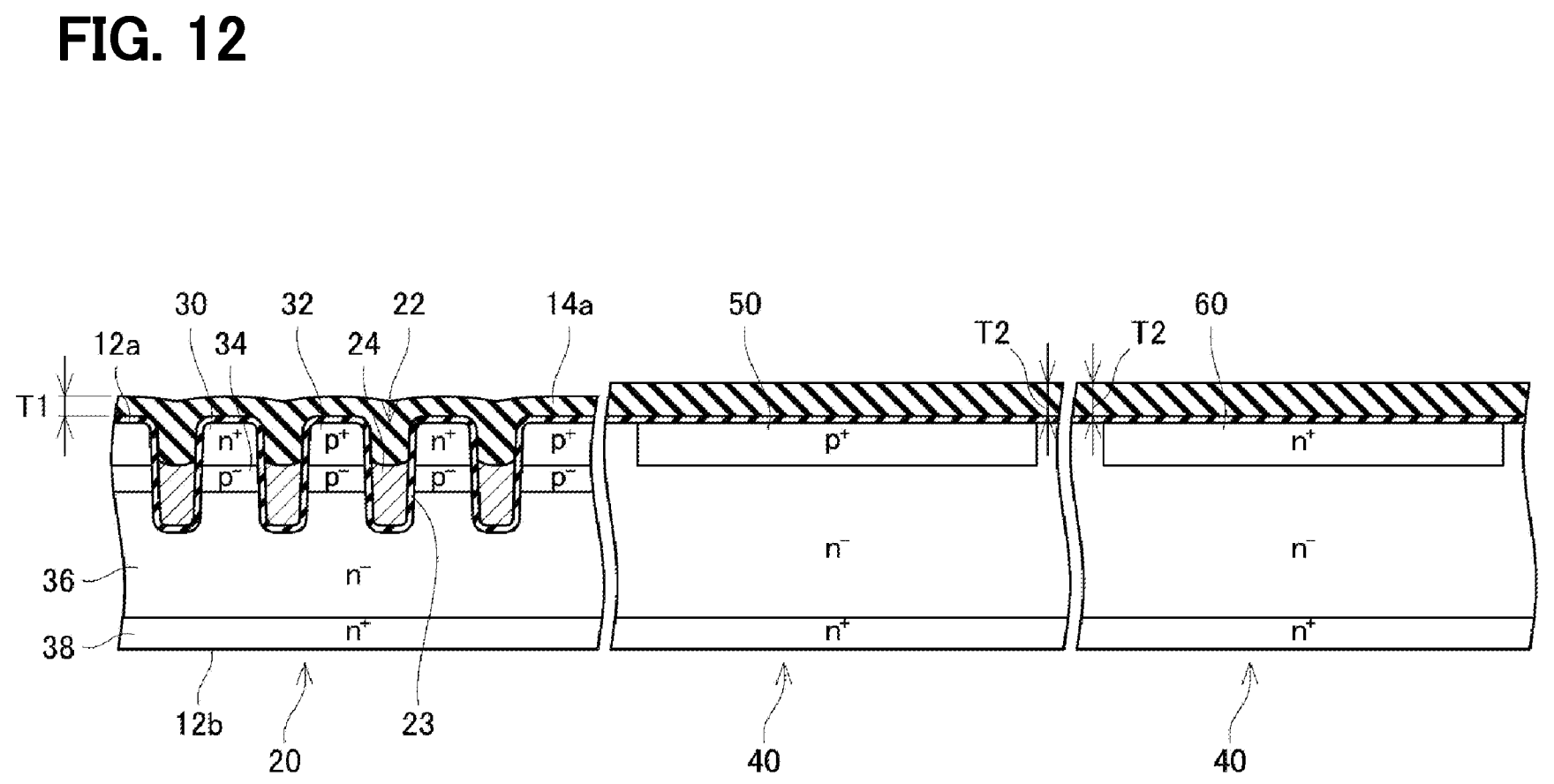
Figure 13:
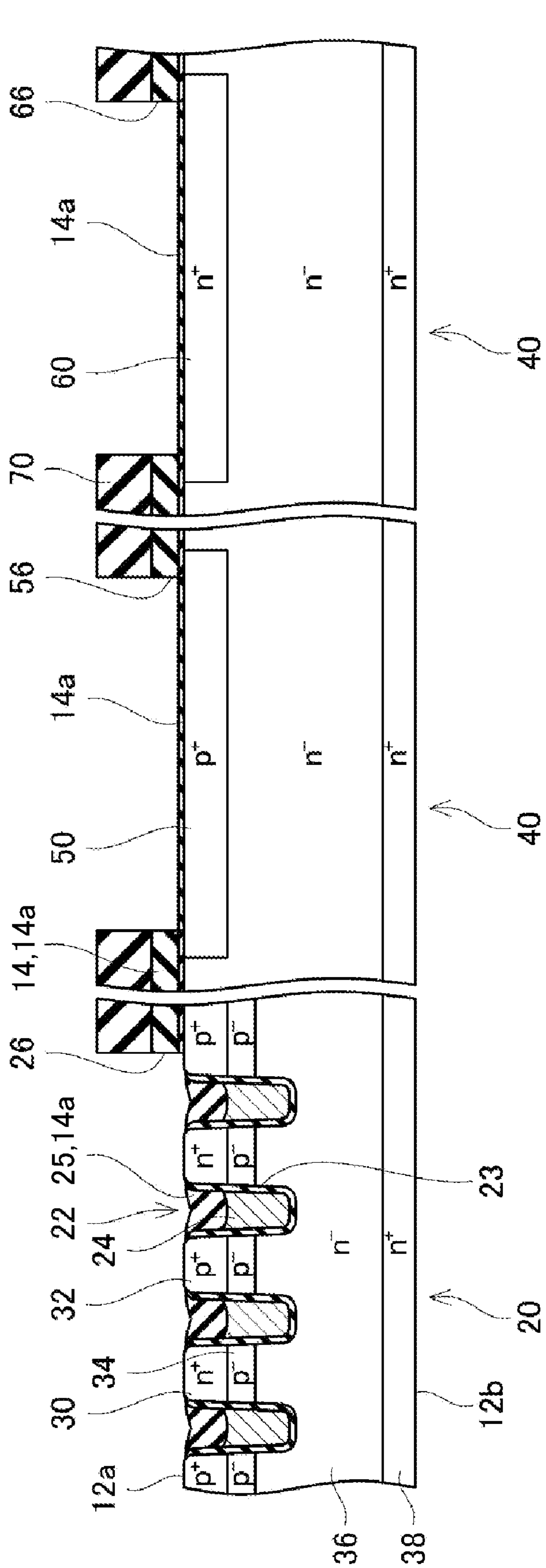
FIG. 13 is a diagram for explaining the manufacturing method of the semiconductor device as the comparative example.

FIGS. 12 and 13 show, as a comparative example, a manufacturing process of a semiconductor device in which the dummy trenches 52 and 62 do not exist in the temperature sensing region 40. In the process of forming the insulating layer 14*a*, the growth rate of the insulating layer 14*a* on the upper surface 12*a* is lower in the vicinity of the trench than at a location where the trench is not present. It is considered that this is because the CVD source gas is consumed by the growth of the insulating layer 14*a* in the trench, and thus the insulating layer 14*a* is less likely to grow on the upper surface 12*a* in the vicinity of the trench. In FIG. 12, since there is no dummy trench in the temperature sensing region 40, the thickness T2 of the insulating layer 14*a* on the upper surface 12*a* in the temperature sensing region 40 is larger than the thickness T1 of the insulating layer 14*a* on the upper surface 12*a* in the element region 20. Therefore, when the contact holes 26, 56, and 66 are formed later, as shown in FIG. 13, a thin insulating layer 14*a* may remain on the upper surface 12*a* in the contact holes 56 and 66, and the upper surface 12*a* may not be exposed. In this case, when electrodes are formed later, the anode electrode 58 cannot be brought into contact with the anode region 50 with low resistance, and the cathode electrode 68 cannot be brought into contact with the cathode region 60 with low resistance. If the etching time is increased, the upper surface 12*a* can be exposed in the contact holes 56 and 66. However, in this case, the thickness of the interlayer insulating layer 25 is reduced in the element region 20, and the withstand voltage of the interlayer insulating layer 25 is decreased.

On the other hand, in the manufacturing method of the present embodiment, since the dummy trenches 52 and 62 are present in the temperature sensing region 40, as shown in FIG. 9, the thickness T2 of the insulating layer 14*a* in the temperature sensing region 40 is substantially equal to the thickness T1 of the insulating layer 14*a* in the element region 20. Therefore, as shown in FIG. 10, when the upper surface 12*a* is exposed in the contact holes 26, 56, and 66, the interlayer insulating layer 25 having an appropriate thickness can be left in the gate trench 22. As such, according to this manufacturing method, the anode electrode 58 and the cathode electrode 68 can be brought into contact with the anode region 50 and the cathode region 60 with low resistance while ensuring the withstand voltage of the interlayer insulating layer 25.

In the embodiment described above, the width of the dummy trenches 52 and 62 is equal to the width of the gate trench 22, and the pitch of the dummy trenches 52 and 62 is equal to the pitch of the gate trenches 22. However, the width of the dummy trenches 52, and 62 may be different from the width of the gate trenches 22, and the pitch of the dummy trenches 52 and 62 may be different from the pitch of the gate trenches 22. Further, in the embodiment described above, the depth of the dummy trenches 52 and 62 is equal to the depth of the gate trenches 22, but the depth of the dummy trenches 52 and 62 may be different from the depth of the gate trenches 22. As described above, even when the dummy trenches 52 and 62 and the gate trenches 22 have different dimensions and pitches, the insulating layer 14*a* can be restricted from becoming thick on the upper surface 12*a* in the temperature sensing region 40 by providing the dummy trenches 52 and 62 in the temperature sensing region 40. However, when the shape and pitch of the gate trenches 22 are equal to the shape and pitch of the dummy trenches 52 and 62, the difference in thickness of the insulating layer 14*a* between the element region 20 and the temperature sensing region 49 can be made smaller.

Further, in the embodiment described above, the gate trench 22 is formed simultaneously with the dummy trenches 52 and 62, but the gate trench 22 and the dummy trenches 52 and 62 may be formed in separate processes.

In the embodiment described above, the dummy electrodes 54 and 64 are formed in the dummy trenches 52 and 62. However, the dummy electrodes 54 and 64 may not be formed in the dummy trenches 52 and 62. For example, the entirety of the dummy trench may be filled with the insulating layer 14*a* without forming the dummy electrode. Even in such a configuration, it is possible to restrict the insulating layer 14*a* from becoming thick on the upper surface 12*a* in the temperature sensing region 40.

Figure 14:
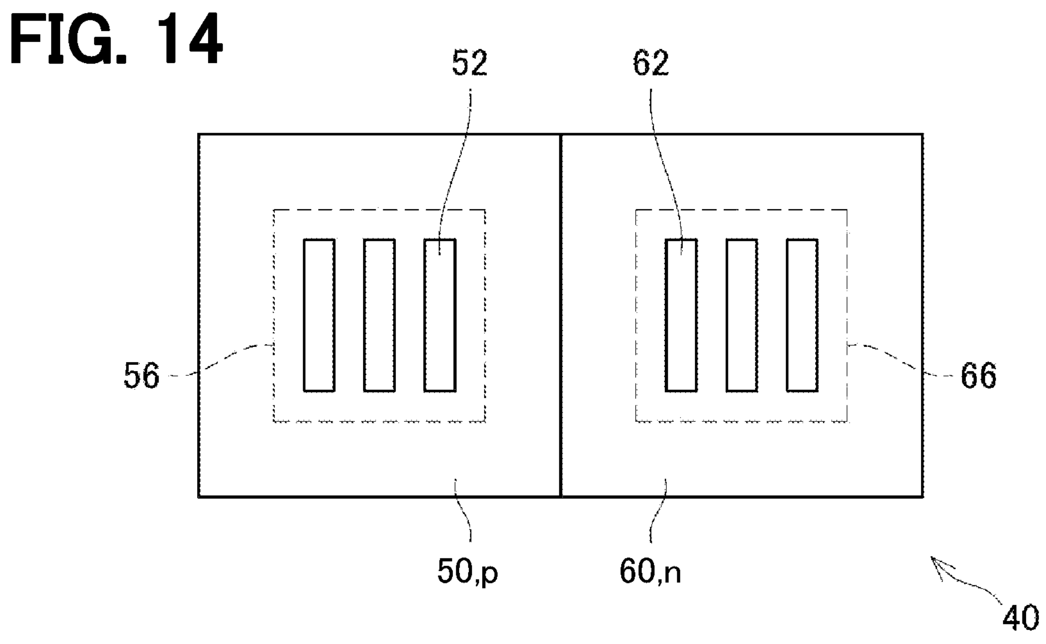
FIG. 14 is an enlarged plan view of a temperature sensing region of a semiconductor device as a first modification.
Figure 15:
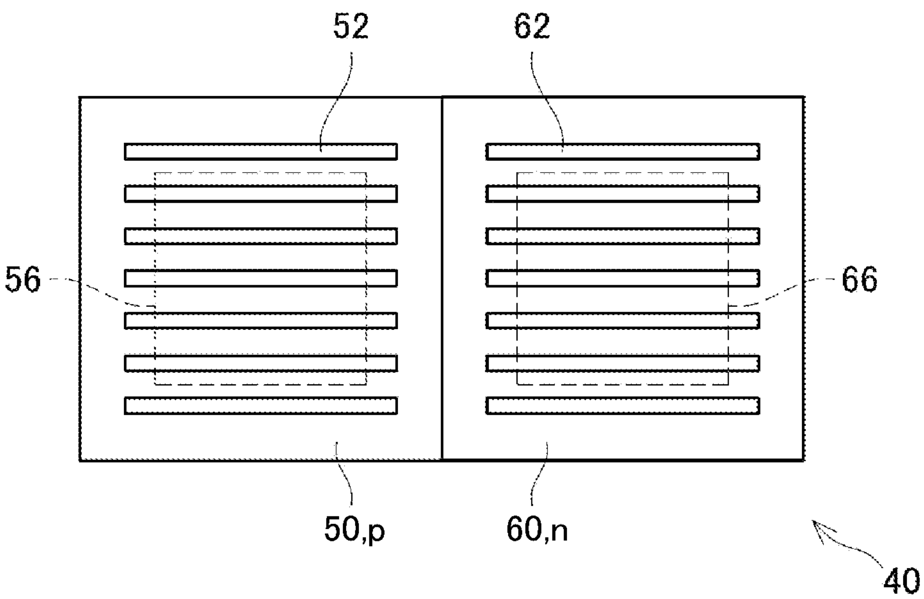
FIG. 15 is an enlarged plan view of a temperature sensing region of a semiconductor device as a second modification.
Figure 16:
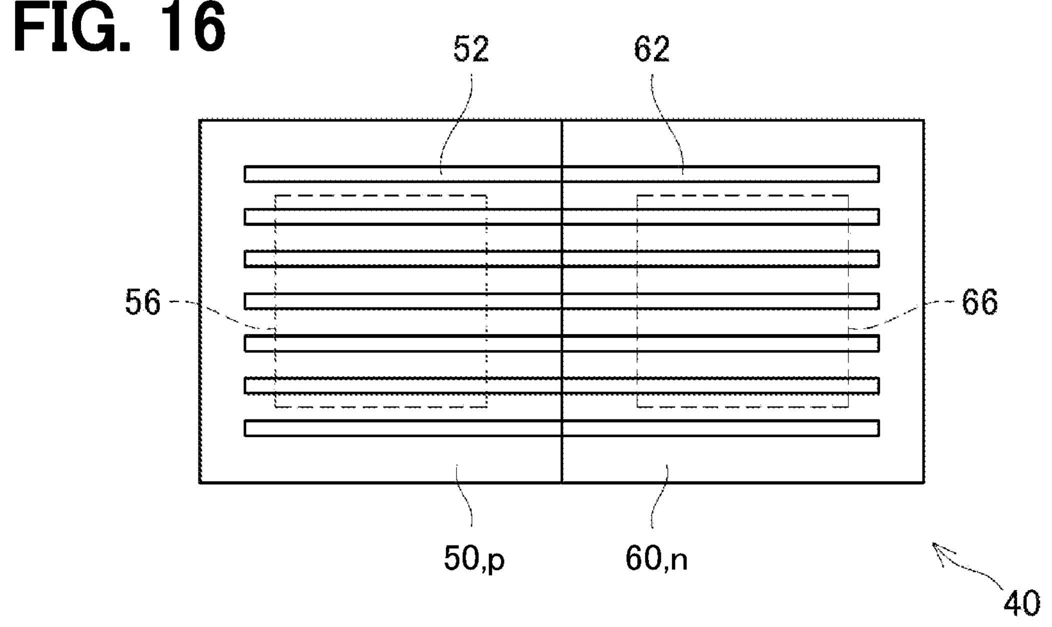
FIG. 16 is an enlarged plan view of a temperature sensing region of a semiconductor device as a third modification.

As shown in FIG. 14, the dummy trenches 52 and 62 may extend in a direction different from that in FIG. 2. As shown in FIG. 15, the dummy trench 52 may extend to the outside of the anode contact hole 56, and the dummy trench 62 may extend to the outside of the cathode contact hole 66. As shown in FIG. 16, the dummy trenches 52 and 62 may be connected to each other.

The dummy trench 52 is an example of a first dummy trench. The insulating layer 55 is an example of a first insulating layer. The dummy trench 62 is an example of a second dummy trench. The insulating layer 65 is an example of a second insulating layer.

While only the selected exemplary embodiments and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiments and examples according to the present disclosure is provided for illustration only, and not for the purpose of limiting the disclosure as defined by the appended claims and their equivalents.

What is claimed is:

1. A semiconductor device comprising:

a semiconductor substrate having an element region provided with a gate switching element and a temperature sensing region provided with a temperature sensing diode, wherein the gate switching element includes:

a plurality of gate trenches provided in an upper surface of the semiconductor substrate;

a gate electrode disposed in each of the gate trenches;

an interlayer insulating layer disposed in each of the gate trenches in a range lower than an upper end of the corresponding gate trench, and covering an upper surface of the corresponding gate electrode;

the temperature sensing diode includes:

a p-type anode region;

an n-type cathode region in contact with the anode region;

a plurality of first dummy trenches provided in the upper surface of the semiconductor substrate in the anode region;

a first insulating layer disposed in each of the plurality of first dummy trenches in a range lower than an upper end of the corresponding first dummy trench;

a plurality of second dummy trenches provided in the upper surface of the semiconductor substrate in the cathode region; and a second insulating layer disposed in each of the plurality of second dummy trenches in a range lower than an upper end of the corresponding second dummy trench, the semiconductor device further comprising:

a surface insulating layer covering the upper surface of the semiconductor substrate;

a source contact hole provided in the surface insulating layer and located above the element region;

a source electrode disposed in the source contact hole and in contact with the interlayer insulating layer disposed in each of the plurality of gate trenches and the upper surface of the semiconductor substrate in the source contact hole;

an anode contact hole provided in the surface insulating layer and located above the anode region;

an anode electrode disposed in the anode contact hole and in contact with the first insulating layer disposed in each of the plurality of first dummy trenches and the anode region in the anode contact hole;

a cathode contact hole provided in the surface insulating layer and located above the cathode region; and a cathode electrode disposed in the cathode contact hole and in contact with the second insulating layer disposed in each of the plurality of second dummy trenches and the cathode region in the cathode contact hole.

2. A method for manufacturing a semiconductor device that includes a gate switching element and a temperature sensing diode, the method comprising:

processing a semiconductor substrate, the processing of the semiconductor substrate including forming a plurality of gate trenches of the gate switching element in an upper surface of the semiconductor substrate, forming a gate electrode in each of the plurality of gate trenches in a range lower than an upper end of each of the plurality of gate trenches, forming a p-type anode region and an n-type cathode region of the temperature sensing diode in the semiconductor substrate, forming a plurality of first dummy trenches in the upper surface of the semiconductor substrate in the anode region, and forming a plurality of second dummy trenches in the upper surface of the semiconductor substrate in the cathode region, forming an insulating layer over the upper surface of the semiconductor substrate so as to fill the plurality of gate trenches, the plurality of first dummy trenches and the plurality of second dummy trenches;

forming a source contact hole, an anode contact hole and a cathode contact hole in the insulating layer by etching so as to satisfy following conditions in which:

the plurality of gate trenches are located in the source contact hole;

the upper surface of the semiconductor substrate is exposed in the source contact hole;

the insulating layer remains in each of the plurality of gate trenches located in the source contact hole in a range lower than an upper end of each of the plurality of gate trenches in a state of covering an upper surface of each of the plurality of gate electrodes;

the plurality of first dummy trenches are located in the anode contact hole; the upper surface of the semiconductor substrate is exposed in the anode contact hole;

the insulating layer remains in each of the plurality of first dummy trenches located in the anode contact hole in a range lower than an upper end of each of the plurality of first dummy trenches;

the plurality of second dummy trenches are located in the cathode contact hole;

the upper surface of the semiconductor substrate is exposed in the cathode contact hole; and the insulating layer remains in each of the plurality of second dummy trenches located in the cathode contact hole in a range lower than an upper end of each of the plurality of second dummy trenches; and forming a source electrode, an anode electrode, and a cathode electrode, the source electrode being formed in the source contact hole to be in contact with the insulating layer in each of the plurality of gate trenches and the upper surface of the semiconductor substrate exposed in the source contact hole, the anode electrode being formed in the anode contact hole to be in contact with the insulating layer in each of the plurality of first dummy trenches and the anode region, and the cathode electrode being formed in the cathode contact hole to be in contact with the insulating layer in each of the plurality of second dummy trenches and the cathode region.

3. The method according to claim 2, wherein a width of each of the plurality of first dummy trenches and a width of each of the plurality of second dummy trenches are equal to a width of each of the plurality of gate trenches, and a pitch of the plurality of first dummy trenches and a pitch of the plurality of second dummy trenches are equal to a pitch of the plurality of gate trenches.

4. The method according to claim 2, wherein the forming of the plurality of gate trenches, the forming of the plurality of first dummy trenches, and the forming of the plurality of second dummy trenches are simultaneously performed.

5. The method according to claim 2, wherein the processing of the semiconductor substrate further includes:

forming a first dummy electrode in each of the plurality of first dummy trenches in a range lower than an upper end of each of the plurality of first dummy trenches; and forming a second dummy electrode in each of the plurality of second dummy trenches in a range lower than an upper end of each of the plurality of second dummy trenches, the forming of the gate electrode, the forming the first dummy electrode, and the forming of the second dummy electrode are simultaneously performed.

* * * * *